United States Patent
Keyl et al.

(10) Patent No.: US 6,937,959 B2
(45) Date of Patent: Aug. 30, 2005

(54) METHOD OF DETERMINING THE DISTANCE OF PROJECTION POINTS ON THE SURFACE OF A PRINTING FORM

(75) Inventors: Hartmut Keyl, Sandhausen (DE); Klaus Mueller, Heidelberg (DE); Thomas Wolf, Karlsruhe (DE); Bernhard Zintzen, Heidelberg (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 0 days.

(21) Appl. No.: 10/674,851

(22) Filed: Sep. 30, 2003

(65) Prior Publication Data

US 2004/0122617 A1 Jun. 24, 2004

(30) Foreign Application Priority Data

Sep. 30, 2002 (DE) .......................................... 102 45 701

(51) Int. Cl.$^7$ ............................................... G01C 17/38
(52) U.S. Cl. ....................... 702/159; 702/150; 382/148; 382/154
(58) Field of Search ................................ 702/154, 159; 382/104, 106, 148, 154; 355/67; 235/462.1

(56) References Cited

U.S. PATENT DOCUMENTS

| 5,832,415 A | 11/1998 | Wilkening et al. ............. 702/86 |
| 2003/0144815 A1 | 7/2003 | Kohler et al. ................. 702/159 |

FOREIGN PATENT DOCUMENTS

| DE | 4437284 | 4/1998 | |
| DE | 19732668 | 2/1999 | |
| DE | 19835303 | 2/2000 | |
| DE | 10144198 | 4/2003 | |
| DE | 10305595 | * 9/2003 | ............. B41C/1/00 |
| EP | 0540244 | 5/1993 | |

* cited by examiner

*Primary Examiner*—Kamini Shah
(74) *Attorney, Agent, or Firm*—Davidson, Davidson & Kappel, LLC

(57) ABSTRACT

A method is described of determining the distance (50, 56) of a projection point (24) of a first imaging beam (22) of imaging device (20) from a measuring point (28) of a measuring device (26) or from a second projection point (36) of a second imaging beam (34) of a second imaging device (32) on the surface (10) of a printing form (12), both the projection point (24) of the first imaging beam (22) and the measuring point (28) of the measuring device (26) or the second projection point (36) being movable in relation to the surface (10) of the printing form (12). In the method, the reflected light intensity of at least a part of a pattern (84), which is produced by the first imaging beam (22) on the printing form (12), is measured as a function of the position of a measuring device (26), so that the distance (50, 56) may be formed as the difference of the position of the measuring device (26) and the correlated position of the imaging beam (22), at which the imaging beam (22) was located when the part of the first pattern (84) was written. The method may advantageously be used in a method of correcting the time triggering of an imaging beam (22), using which a projection point (24) may be produced on a surface (10) of a printing form (12).

16 Claims, 5 Drawing Sheets

METHOD OF DETERMINING THE DISTANCE OF PROJECTION POINTS ON THE SURFACE OF A PRINTING FORM

Priority to German Patent Application No. 102 45 701.8, filed Sep. 30, 2002 and hereby incorporated by reference herein, is claimed.

BACKGROUND INFORMATION

The present invention relates to a method of determining the distance of a projection point of a first imaging beam of an imaging device on a surface of a printing form from a measuring point of a measuring device on the surface of the printing form, both the projection point of the first imaging beam and the measuring point of the measuring device being movable in relation to the surface of the printing form, and the position of the imaging beam and the position of the measuring point with respect to the surface of the printing form in relation to a fixed point being determinable. Furthermore, the present invention relates to a method of determining the distance of a first projection point of a first imaging beam of a first imaging device on a surface of a printing form from a second projection point of a second imaging beam of a second imaging device on the surface of the printing form.

For creating an image on a printing form, whether it is accomplished in a printing form imager or a direct imaging printing unit, using an imaging beam, in particular a laser light beam, the distance between the imaging beam source of the imaging device and the surface of the printing form must be known with sufficient precision so that appropriate imaging parameters of the imaging beam may be set to produce a printing dot of desired size at the location of the projection point of the imaging beam. One important method is to determine the distance between the imaging device and the surface of the printing form directly using a measuring device. A measured value obtained in this way may be processed in a control unit of the imaging device to change the optical path from the imaging device to the surface, in an auto-focus system for an imaging optic, for example, or to select specific parameters of the light source, such as the necessary intensity of the imaging light. The measuring point of the measuring device is generally not automatically at the position of the projection point of the imaging beam at the time of the measurement, rather the position of the measuring point is reached by the projection point only at a later time, after (typically uniform) movement of the imaging device in relation to the surface of the printing form. For the triggering of the imaging beam to actually occur precisely at the time at which the projection point reaches the position of the measuring point at the instant of the measurement, precise knowledge of the distance of the projection point from the measuring point at the instant of the measurement is necessary if the (uniform) relative speed is known. The imaging result reacts particularly sensitively to deviations from the precise triggering instant in regions of the surface of the printing form on a rotating body, in particular on a printing form cylinder, in which the printing form does not rest uniformly on the outer surface of the rotating body (e.g., plate bubble).

In order to reduce the time for producing a complete image on the surface of a printing form, often multiple imaging beams are used for simultaneously writing printing dots in parallel. The imaging beams may be positioned individually or in groups on one or more imaging devices. In order for a printing image to be produced by multiple imaging beams whose printing dots have the same position in relation to one another as if they had been produced by only one imaging beam, the distances of the projection points of the imaging beams at a point in time must be known precisely, so that a changed position of the printing dots is possibly achieved through delayed or advanced triggering of the imaging beam at known (uniform) speed. In this way, shifts and/or gaps or overlaps or the like which would occur in the printing image if the triggering was unchanged may be compensated for.

An obvious possibility for managing or even avoiding the problem described above is to determine the distance of the projection points of the imaging beam or the distances of the projection points of the imaging beams from the measuring point of the measuring device in a calibration measurement during the assembly or manufacture of the imaging device and the distance measuring device, which is preferably integrated into the imaging device. Calibration may also be performed during assembly of multiple imaging devices, frequently having a shared linear actuator system, to form an imaging unit. Precision measurement having subsequent electronic (triggering instant) or mechanical (position variation) correction may be performed using an optical bench and beam measuring devices. It is disadvantageous that this method is relatively complicated and generally may no longer be used for adjustment of the imaging devices when they are incorporated into the printing unit, in particular in the field at the client, a situation in which conditions different from those on an optical bench exist. In addition, a single setting before delivery may not take into consideration possible influences of aging, temperature, or the like, which only occur during operation.

An array of solutions is already known which allow potential use at the client. For example, in German Patent Application No. 102 03 694.2, a method of determining the relative position of a first and a second imaging device to one another is described, in which surface coverages of a series of combination patterns imaged by both imaging devices are compared to surface coverages of reference patterns imaged by one imaging device. The comparison may advantageously be performed on a printed printing material. An identified combination pattern having identical surface coverage to the reference pattern is uniquely assigned a deviation from a setpoint distance.

It is known, from German Patent Application No. 44 37 284 A1, for example, that a calibration of a controller for the deflection of a laser beam may be performed as follows. A light-sensitive medium is irradiated by the laser beam to produce a test image and digitized image sections are subsequently produced from this test image, which are recorded by a CNC-controlled camera. Correction data for controlling the deflection of the laser beam is computed on the basis of a comparison of the actual positions of the laser beam measured by the recording of the image sections with predetermined setpoint positions. The use of this method has the disadvantage, among other things, of requiring the use of precise CNC control for the camera, which is therefore costly.

A device and a method for calibrating beam scanning devices is disclosed in German Patent Application No. 197 32 668 A1, in which a surface having defined markings is scanned in such a way that a detector device may produce a signal when a marking is detected by the scanned beam. A correction signal for the beam deflection may be produced using a comparison between the detector signals and the corresponding setpoint positions.

A device and a method for automatic alignment of an inkjet printer cartridge also exists in this context. For example, European Patent Application No. 0 540 244 A2 describes that an optical sensor having a quad photodiode may be mounted on the carriage of an inkjet printer. Using the optical sensor, the position of horizontal and vertical test lines, which are printed using the inkjet in a test procedure, may be determined, so that a correction to a setpoint position may be performed, in particular mechanically as a position correction of the cartridge.

The technical teachings of the procedures described are not directly applicable to devices for producing images on printing forms in printing units.

BRIEF SUMMARY OF THE INVENTION

An object of the present invention is to provide a method, using which the position of an imaging position in relation to the position of a distance sensor or in relation to a further imaging position on the surface of a printing form, which is accommodated in the printing unit of a printing press in particular, may be determined easily, so that an automatic position compensation may be performed using the control unit of the imaging device.

The present invention is based on, among other things, the idea of using the measuring device necessary for the distance measurement between the imaging device and the surface of the printing form also to determine distances of projection points on the surface of the printing form, in particular to be able to perform a position compensation of the projection points. The fact that the reflectivity of a region of the surface of the printing form containing an image differs from the reflectivity of a region of the surface which does not contain an image is exploited.

According to the present invention, the method of determining the distance of a projection point of a first imaging beam of an imaging device on a surface of a printing form from a measuring point of a measuring device on the surface of the printing form, both the projection point of the first imaging beam and the measuring point of the measuring device being movable in relation to the surface of the printing form, in particular being accommodated in a printing unit of a printing press, and the position of the imaging beam and the position of the measuring point on the surface of the printing form being determinable in relation to a fixed point, such as a zero point of a controlled actuator system or an origin of the coordinate system, includes the following steps: a first pattern is imaged by the first imaging beam, as a function of the position of the imaging beam, on the printing form in at least one direction which spans the surface of the printing form. The reflected intensity of at least a part of the light illuminating the first pattern is measured as a function of the position of the measuring device. At least one position of the measuring device is correlated with the position of the imaging beam at which the imaging beam was located as the part of the first pattern was written. Multiple positions of the measuring device may also be correlated to multiple positions of the imaging beam, so that a statistical analysis of multiple correlations may be performed. Finally, the difference of the at least one position of the measuring device and the position of the imaging beam is produced, which represents the distance to be determined. It is immediately clear that in the context of the present invention, the measuring point is the projection point of a measuring beam and may also be referred to as such.

In other words, the distance is determined on the basis of a differential measurement of at least one coordinate of a spanning direction to a fixed point. A specific part of a pattern, in particular a specific image spot, is set by the first imaging beam at a position at which the imaging device is located at a first position coordinate. This specific part of the pattern is detected by the measuring beam when the imaging device is located at a second position coordinate. The difference of the position coordinates provides the distance desired.

It is immediately clear to one skilled in the art that the distance considered in the context of the present invention is signed, and may therefore be either positive or negative. In other words, since any direction is also assigned an orientation, the distance may be oriented in the same direction (positive) or in the opposite direction (negative) relative to the direction. In certain situations, only the absolute value of the distance may be significant. However, the path between the position of the imaging beam and the position of the measuring device is frequently scanned in a specific direction, so that an orientation and therefore a sign are defined.

In regard to the pattern used in the context of the present invention, it is to be noted that a pattern primarily contains topological information. A pattern has a topology. In other words, each point in a pattern has a relationship to the neighboring points in the pattern, every point is assigned neighboring points in a vicinity, independently of the geometric implementation of the pattern, i.e., its position (translation and/or rotation), its scaling, its distortion through similarity transformations, such as clipping, homomorphism, or the like, for example. A pattern is represented by a spatially (on the printing form surface) differing intensity distribution. The representation of the pattern is a function of the position of the imaging beam. The geometrical information exists in the position of the points of the pattern as a function of the position of the imaging beam. In particular, a pattern may be a linear pattern, a coded linear pattern, a grid pattern, a coded grid pattern, or the like.

To produce an image on a bidimensional surface of a printing form using one or more imaging devices, the surface is scanned in two linearly independent coordinate directions, which span the surface, in that a relative motion between the surface and the imaging device(s) is produced by a suitable actuator system. The scanning is typically performed in a rapid scanning direction (e.g., the circumference of a printing form mounted on a rotating body) and a slow scanning direction (e.g., the direction essentially parallel to the axis of the rotating body) in such a way that all points to be imaged on the surface are scanned by the imaging device(s), or more precisely by multiple imaging beams. In this case, an imaging beam may be a light beam, in particular a laser light beam, whether it is in the infrared, visible, or ultraviolet spectral range, a heat pulse, a gas jet, or a droplet of a chemical substance or the like. An imaging device, also referred to as an imaging module, may have one or more imaging beams. In this case, printing forms are also understood as printing plates, printing form precursors, films, or the like. Currently, laser light sources, preferably infrared, are especially widespread in imaging devices for producing images on imaging media in the graphic industry, whether in the pre-printing stage in the printing form imagers or in the printing stage in printing units (on-press imaging or direct imaging printing units). Laser light sources are frequently diode lasers or solid-state lasers, such as lasers having amplifying media made of Ti:sapphire or Nd:YLF, preferably diode-laser pumped. Multiple laser light sources may be located on one or more combined diode laser bars in an imaging device. The imaging beams are preferably individually controllable.

An imaging device may include one imaging beam or a group of imaging beams. Multiple imaging devices may be integrated into a functional block. To image or inscribe the surface of the printing form, the imaging beams are switched on and off (time triggering). When time triggering or triggering instants are mentioned in the context of the present invention, comparable instants, such as the switching-on instants are to be understood in this case. Depending on the imaging method selected, a relative motion between the projection point and the surface may or may not occur while at least one imaging beam is switched on. An image may be transferred onto a printing material using an imaged or inscribed printing form. Typical printing materials are paper, cardboard, organic polymer films, or the like, whether they are sheets or webs.

In an advantageous embodiment of the method according to the present invention of determining the distance of a projection point from a measuring point, it is provided as an additional step that the imaged printing form is inked using printing ink before the light reflection is measured. The contrast between imaged and non-imaged regions on the surface may advantageously be elevated by the printing ink.

In a consistent implementation of the method according to the present invention, imaging may be performed using the first pattern in two linearly independent, preferably orthogonal, directions which span the surface of the printing form. The first pattern may therefore be implemented in such a way that it extends in two linearly independent directions. The pattern may therefore be developed bidimensionally. Determination of distance may be performed in both linearly independent directions. In other words, the projected distances may be determined on both of the linearly independent, preferably orthogonal directions.

In a preferred embodiment of the method according to the present invention, the measuring device is a triangulation sensor. The triangulation sensor may include a laser light source, in particular a laser diode, an imaging optic system, and a bidimensional or unidimensional image sensor (or even multiple image sensors positioned bidimensionally or unidimensionally). Advantageous embodiments of bidimensional or unidimensional image sensors are CCD detectors (preferably 2-D CCD arrays or CCD lines, for example) PSD detectors, CMOS detectors, or the like. A preferred triangulation sensor has an electronic system implemented which not only determines the position displacements of the reflected beam, but also the quantity of the total incident light output on the bidimensional or unidimensional image sensor. This information may be used for the purpose of regulating the output of the laser light source in such a way that the signal strength is maintained. For example, the degradation of the laser light source may thus be recognized and compensated for by increasing the power output, in particular by increasing the electrical pump power output. Changes of the reflection on the surface to be detected are also compensated for in this way.

If the method according to the present invention of determining the distance of a projection point from a measuring point is used, the surface of the printing form forming at least a part of a lateral surface of a rotating body, the printing form being accommodated on a printing form cylinder or, in particular, forming the surface of a printing form cylinder, an angle encoder may advantageously be used for position determination in the peripheral direction and a path measuring system may be used for position determination in the translation direction essentially parallel to the axis of the rotating body, in particular the printing form cylinder. If the actuator system for the translation is implemented by one or more stepping motors (each having a rotor part), the path measuring system may be based on the activation signals for the stepping motors. In other words, the position of the rotor part or the positions of the rotor parts are determined from the correspondence of the activation signals of the stepping motors(s). It may be expedient for stepping motors to perform measurements for a direction both in the first orientation and the second orientation of a distance (back and forth), so that a possibly existing systematic error may be taken into consideration or eliminated. Alternatively to this, optical position detection using sensors may be provided, independently of the embodiment of the actuator system.

In the method according to the present invention, an array of measures may be used to increase the sensitivity of the measurement. In one embodiment, the reflected intensity may be measured in a measuring raster, the axial directions of the measuring raster being linearly independent from at least one direction of the imaging pattern. In other words, the imaging pattern and measuring raster are angled, rotated, or tilted in relation to one another. Additionally or alternatively to this, measurements of the reflected intensity may be performed in a measuring raster which is finer than the imaging pattern. In particular, this procedure is expedient for measuring points whose dimensions are large in relation to the desired precision. If multiple measured values are recorded and subsequently developed using the window function which characterizes the large measuring point, the fine shape of the imaging pattern may be determined. Additionally or alternatively to this, the imaging pattern may have periodicity in at least one direction. Periodicity causes the imaging pattern to include multiple comparable points, so that averaging or statistical analysis of the measurement results may be performed for these comparable points.

An advantageous refinement of the method according to the present invention results in a method of determining the distance of a first projection point of a first imaging beam of a first imaging device on a surface of a printing form from a second projection point of a second imaging beam of a second imaging device on the surface of the printing form, using a measuring point of a measuring device, having the following steps: a first pattern is imaged by the first imaging beam, as a function of the position of the first imaging beam, on the printing form in at least one direction which spans the surface of the printing form. A second pattern is imaged by the second imaging beam, as a function of the position of the second imaging beam, on the printing form in at least one direction which spans the surface of the printing form. The reflected intensity of at least a part of the light illuminating the first pattern is measured as a function of the position of the measuring device. The reflected intensity of at least a part of the light illuminating the second pattern is measured as a function of the position of the measuring device. Finally, the difference of the at least one position of the measuring device at a measuring point in the second pattern and the correlated position of the measuring device at a measuring point in the first pattern is produced. In this case, positions of projection points in the first and second patterns which are written at the same triggering instant of the first and second imaging beams are correlated. For this method according to the present invention, it is advantageously not necessary to know the absolute measuring place, i.e., the absolute coordinates of the measuring point. In other words, it is a direct distance measurement.

Alternatively to this, an advantageous refinement of the method according to the present invention results in a method of determining the distance of a first projection point of a first imaging beam of a first imaging device on a surface of a printing form from a second projection point of a second imaging beam of a second imaging device on the surface of the printing form, having the following steps: the distance of the first projection point of the first imaging beam of the first imaging device on the surface of a printing form from a measuring point of a measuring device on the surface of the printing form is determined using the method according to the present invention described in this description. The distance of the second projection point of the second imaging beam of the second imaging device on a surface of the printing form from a measuring point of a measuring device on the surface of the printing form is also determined using the method according to the present invention described in this description. Finally, the sum of the difference of the at least one position of the measuring device and the position of the first imaging beam and the difference of the at least one position of the measuring device and the position of the second imaging beam is produced, which represents the distance to be determined.

In other words, the distance is determined on the basis of two differential measurements of at least one coordinate of a spanning direction to a fixed point. The signed difference of the distances of the projection points from the measuring point provides the distance desired.

The situation that the method according to the present invention for determining the distance of a first projection point from a second projection point may be used if the first imaging device and the second imaging device are identical is also related to the present invention. In other words, the method steps described are also applicable to a first and a second imaging beam of an imaging device.

In a preferred embodiment of the method according to the present invention of determining the distance of a first projection point from a second projection point, the first pattern imaged using the first imaging beam and the second pattern imaged using the second imaging beam are at least partially in one another or are transposed into one another. An arrangement of this type of the first and second patterns in relation to one another has the advantage, among other things, that measuring points of both patterns may be recorded using a measuring track along a simple, straight path, for example. A simple relative measurement of the distance is possible.

In a consistent refinement, the present invention provides a method of correcting the time triggering of a first imaging beam of a first imaging device, through which a first projection point on a surface of a printing form may be produced, from a first triggering instant to a second triggering instant, having the following steps: the distance of the first projection point to a measuring point or to a second projection point is determined using the method according to the present invention described in this description, the imaging beam being activated at the first triggering instant. The difference of the distance determined and a setpoint distance is produced. Finally, the second triggering instant is determined as the sum of the first triggering instant and the time which is necessary, taking into consideration the relative speed of the first imaging beam and the surface of the printing form in the orientation of the distance, in order to scan the difference from the first projection point.

As a consistent refinement which is symmetrical thereto, the present invention provides a method of correcting the time triggering of a measuring beam of a measuring device, through which a measuring point may be produced on a surface of a printing form, from a first triggering instant to a second triggering instant, having the following steps: the distance of the measuring point to a first projection point is determined using the method according to the present invention described in this description, the measuring point being activated at the first triggering instant. The difference of the distance determined and a setpoint distance is produced. Finally, the second triggering instant is produced as the sum of the first triggering time and the time which is necessary, taking into consideration the relative speed of the measuring beam and the surface of the printing form in the orientation of the distance, in order to scan the difference from the first projection point.

It is emphasized again here that the method according to the present invention provides a technical teaching which allows the easy determination of the position of an imaging position in relation to the position of a distance sensor or in relation to a further imaging position on the surface of a printing form, which is accommodated in the printing unit of a printing press, even after delivery of the printing press to the client. The values established may be stored in the control unit. Using the control unit of the imaging device, an automatic position compensation may be performed, so that influences on the imaging device during operation may be compensated for.

The method according to the present invention and/or its refinements may be implemented in the form of a computer program in the control unit of one or more imaging devices in a read-only or volatile memory. The computer program, which includes program steps which may perform the method according to the present invention and/or its refinement, may also be stored on a portable storage medium, in particular a diskette. A printing unit according to the present invention, in particular a direct or indirect planographic printing unit, a flexographic printing unit, or an offset printing unit, having at least one first imaging device, a measuring device, and at least one control unit, is distinguished in that the control unit includes an electronic system having a memory unit in which a computer program for determining a distance using a method described in this description or for correcting time triggering using a method described in this description is stored. A printing press according to the present invention has at least one printing unit according to the present invention. The printing press may be a sheet-fed or web-fed press.

BRIEF DESCRIPTION OF THE DRAWINGS

Further advantages and advantageous embodiments and refinements of the present invention are explained on the basis of the following figures and their descriptions. In detail.

DETAILED DESCRIPTION

Figure 1:
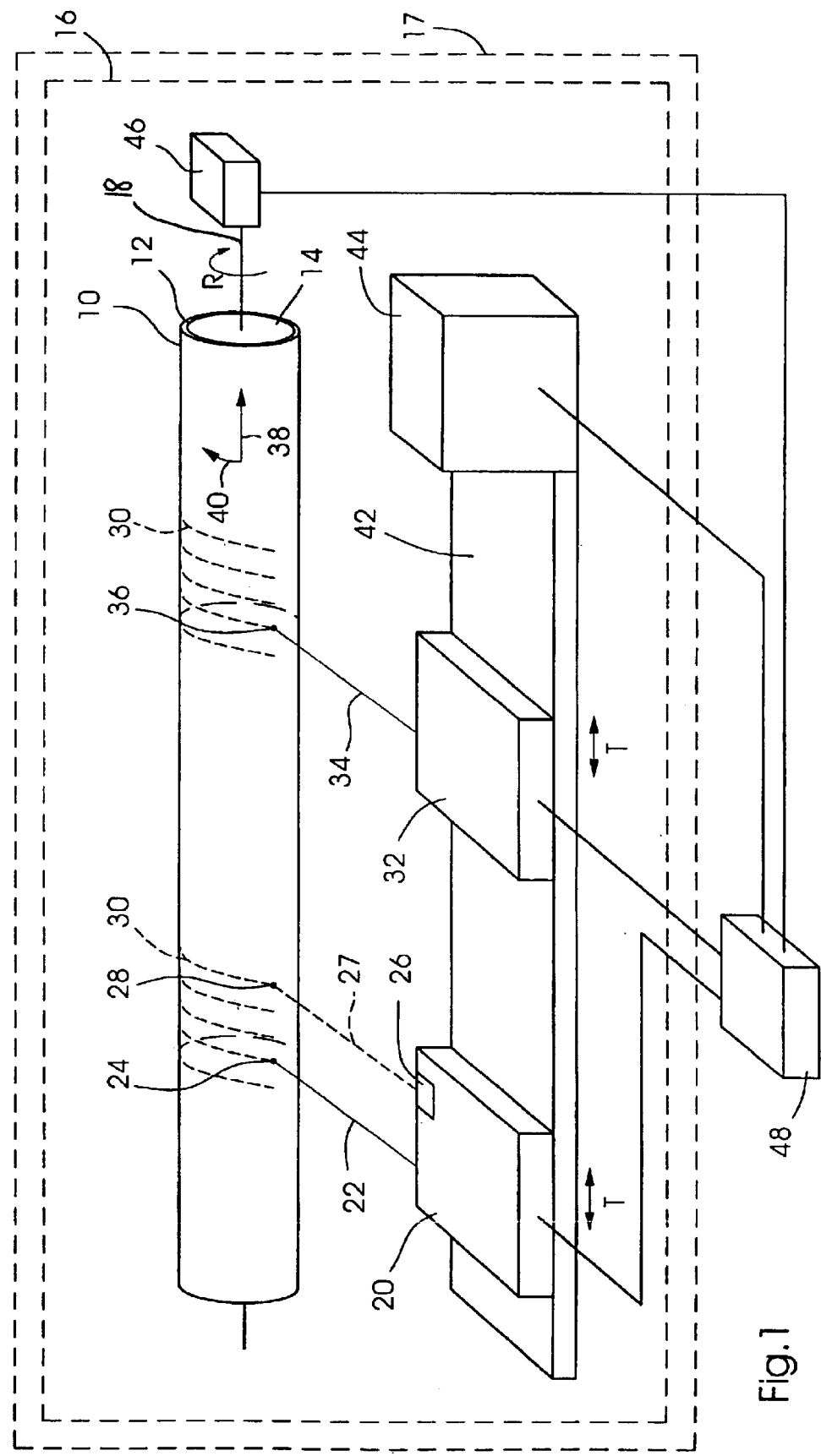
FIG. 1 shows a schematic illustration of an arrangement of two imaging devices for producing an image on a printing form mounted on a cylinder in a printing unit of a printing press.

FIG. 1 shows an example of an arrangement of a first imaging device 20 and a second imaging device 32 for producing an image on surface 10 of a printing form 12 mounted on a printing form cylinder 14 in a printing unit 16 of a printing press 17. Imaging devices 20, 32 are connected to a control unit 48, which is implemented in such a way that the method according to the present invention and/or its refinements may be executed in it as a computer program or a section of a computer program.

The printing form cylinder is mounted in printing unit 16 rotatably around its axis of rotation 18 in rotation direction R. First imaging device 20 and second imaging device 32, preferably individually activatable diode laser bars, are movable essentially parallel to axis of rotation 18 of printing form cylinder 14 in translation direction T using a linear actuator system 42. Surface 10 of the printing form has a first direction 38 (axial direction) and a second direction 40 (peripheral direction), which are linearly independent from one another, in particular orthogonal to one another. By combining rotation R and translation T, imaging beams 22, 36 of imaging devices 20, 32 may completely scan surface 10 of printing form 12 and cover it densely with printing dots. First imaging device 20 emits a first imaging beam 22, which hits surface 10 of printing form 12 at a first projection point 24. A measuring device 26, in an advantageous embodiment a triangulation sensor, is integrated into first imaging device 20. Measuring device 26 emits a measuring light beam 27 which hits surface 10 of printing form 12 at a measuring point 28. Second imaging device 32 emits a second imaging beam 34 which hits surface 10 of printing form 12 at a second projection point 36. To simplify the description, an explanation of the geometry is given here without explaining in detail the time triggering (switching on and off) of imaging beams 22, 34 and measuring light beam 27 involved.

By combining rotation R and translation T, paths 30 of the projection points run helically around printing form cylinder 14. If there is a precise setpoint distance between first projection point 24 and measuring point 28, measuring beam 27 hits its measuring point 28 at the instant of measurement at a location of surface 10 of printing form 12 at which projection point 24 of first imaging beam 22 only comes to rest at a later instant. If there is a precise setpoint distance between imaging devices 20, 32, second projection point 36 lies on path 30 of first projection point 24.

The angular position of printing form cylinder 14 and therefore the coordinate position of surface 10 of printing form 12 in second direction 40 (peripheral direction) may be determined using an angle encoder 46. The axial section position, position in translation direction T, of the imaging beams or imaging devices on surface 10 of printing form 12, and therefore the coordinate position in first direction 38 (axial direction) may be determined using a path measuring system 44 of linear actuator system 42. Both the angular positions and the axial section positions may be transmitted to control unit 48. When the method according to the present invention is performed, the measured coordinate positions are transferred to control unit 48, so that a correlation of the coordinate positions of the imaging pattern to the coordinate positions of the measured values may be performed.

Figure 2:
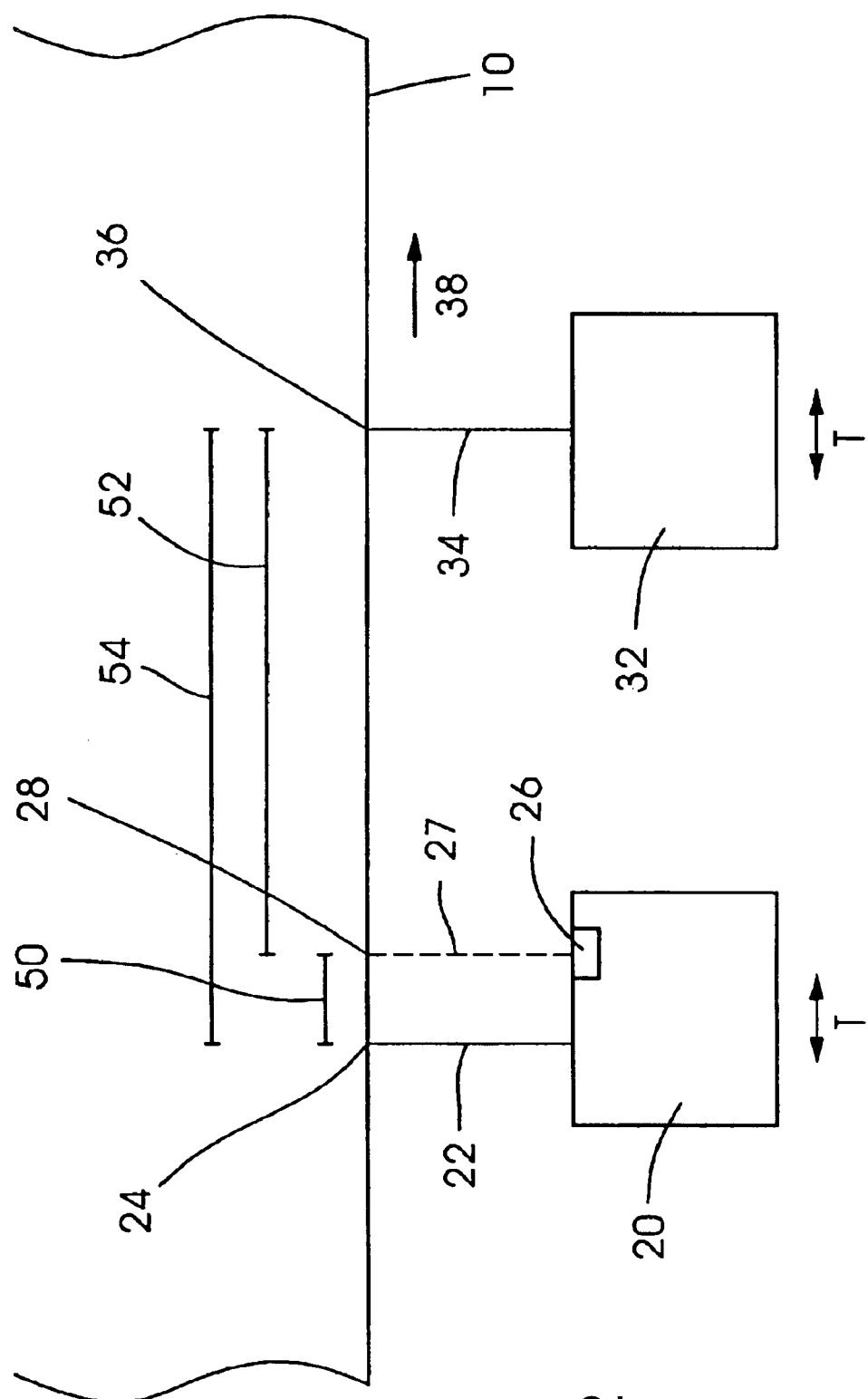
FIG. 2 shows a schematic illustration to explain an embodiment of the method according to the present invention for determining the distance of a first projection point from a measuring point or from a second projection point in a direction essentially parallel to the axis of the printing form cylinder.

FIG. 2 is a schematic illustration to explain an embodiment of the method according to the present invention for determining the distance of a first projection point 24 from a measuring point 28 or from a second projection point 36 in direction 38 essentially parallel to axis 18 of printing form cylinder 14. First imaging device 20 emits a first imaging beam 22 which hits surface 10 of the printing form at first projection point 24. Measuring device 26 integrated into first imaging device 20 emits a measuring light beam 27, which hits the surface at a measuring point 28. First projection point 24 and measuring point 28 have a distance 50 in first direction 38. Second imaging device 32 emits a second imaging beam 34 which hits surface 10 at a second projection point 36. Measuring point 28 and second projection point 36 have a distance 52 in first direction 38. Therefore, distance 54 between first and second projection points 24, 36 is equal to the (signed) sum of distance 50 and distance 52.

The position of a point already imaged on the surface may be measured by utilizing the information about the total reflected light intensity. Distance 50 of measuring point 28 to first projection point 24 in relation to distance 52 of measuring point 28 to second projection point 36 may be determined, and it is also possible to determine distance 54 of first projection point 24 to second projection point 36. An embodiment of the method according to the present invention for the determination of distance 50 of measuring point 28 to first projection point 24 in first direction 38 will be described briefly. An image is produced on a suitable pattern, i.e., a pattern having imaged and non-imaged sections, along direction 38 on surface 10 by first imaging beam 22. The pattern is provided to control unit 48 (see FIG. 1) as a function of the coordinate positions in direction 38. As already mentioned above, the surface may optionally be inked using printing ink to elevate the contrast. The measuring procedure follows: it is not the distance values (the main intended purpose of measuring device 26) that are stored, but rather the total brightness values, the measured reflected intensity, together with the coordinate positions. Now, through a suitable algorithm, the comparison, or more precisely the correlation of imaging coordinate positions and measuring coordinate positions, may be performed in control unit 48, so that distance 50 may be determined from one difference or multiple differences.

Figure 3:
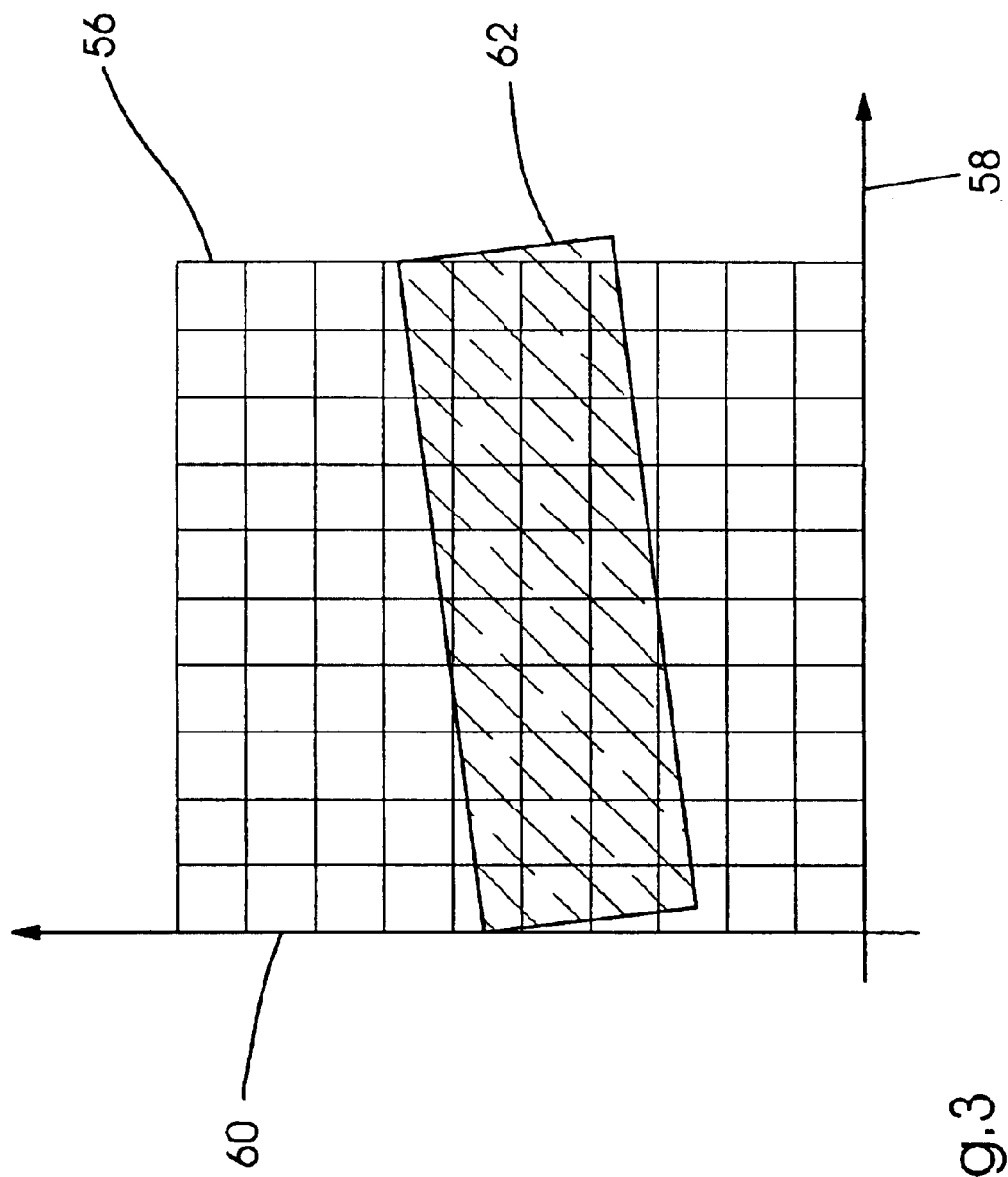
FIG. 3 shows a schematic illustration to explain an embodiment of the method according to the present invention, in which the imaged pattern and the measuring raster are slightly tilted in relation to one another.

FIG. 3 schematically shows an embodiment of the method according to the present invention in which an imaged pattern 62 and measuring raster 56 are slightly tilted in relation to one another. In order to determine the coordinate position of measuring point 28, which is at least one order of magnitude better than the resolution of measuring raster 56 and the diameter of the measuring beam at measuring point 28, at normal imaging speed and using measuring raster 56, which is typical for imaging, a surface is imaged which is slightly tilted in relation to measuring raster 56, spanned by a first measuring raster direction 58 and a second measuring raster direction 60. The measurement is then very sensitive in regard to displacement of imaged pattern 62 in measuring raster 56. A slight displacement in either of first or second measuring raster directions 58, 60 causes, for those raster areas having surface coverage of somewhat less than 50%, classification as non-imaged at one bit resolution, and for those raster areas having surface coverage of somewhat more than 50%, classification as imaged at one bit resolution. The tilt angle determines a lever in relation to measuring raster 56, which is larger the smaller the angle is. A measuring device which is preferably used even has a resolution of 8 bits. Using analysis of the grayscale values in measuring raster 56, the goal of resolution increased by one order of magnitude, or a factor of 10, is achievable even taking other measuring errors which arise into consideration.

Figure 4:
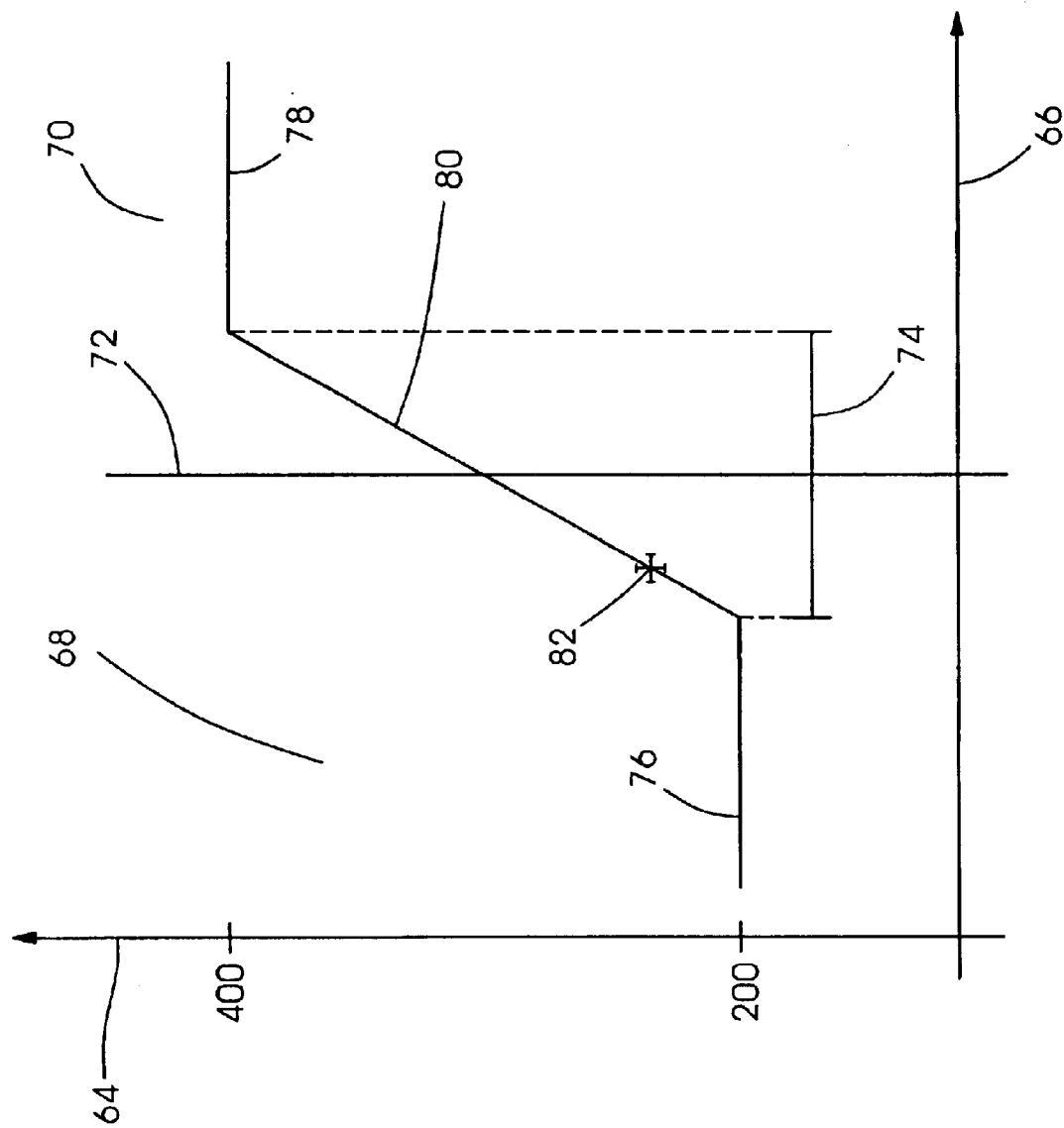
FIG. 4 shows a diagram to explain an embodiment of the method according to the present invention, in which measurements of the reflected intensities are performed in a measuring raster which is finer than the imaging pattern.

FIG. 4 is a diagram to explain an embodiment of the method according to the present invention, in which measurements of the reflected intensity are performed in a measuring raster 56, which is finer than imaging pattern 84. Another possibility for increasing the resolution of the determination of the coordinate positions is to select a very low relative speed between measuring point 28 and surface 10 (FIG. 1), while maintaining the measuring frequency at the same time, so that a very fine measuring raster 56 (FIG. 3) is produced. During a measurement of the reflectivity, a time error bandwidth of only one time unit is achievable, using which the illumination time is controlled to establish an optimum distance value. This time error bandwidth corresponds, under typical imaging conditions, to 2.5 micrometers offset in the position measurement. In the diagram of FIG. 4, reflectivity (brightness, reflected intensity) is plotted along axis 64 as a function of the path length along axis 66. A measure for the reflectivity or the reflected intensity (remission) of the surface of the printing form is, in one embodiment of the measuring device which has an electronic threshold adjustment, for example, the exposure duration of the light source which illuminates the surface or the sensitivity of the bidimensional or unidimensional detector, in particular the CCD detector. A situation of a black-white transition is shown, a border 72 between an imaged region 68 and a non-imaged region 70. If the measuring point having diameter 74 is moved over the border, the brightness value, the measured reflected intensity, changes in accordance with the position of the measuring point, in this example in the measure of the exposure duration. The exposure time of exposure duration 76 of the imaged printing form does not increase steeply due to the expansion of the measuring point, such as along border 72 to exposure duration 70 of the non-imaged printing form, but rather has a flattened shape, exposure time change 80 during the transition. Multiple measurements may be made as a function of the forward movement speed, so that the error arising may be determined. Developing may be performed in order to calculate the influence of the measuring point expansion. In this way, a position determination may be achieved having a precision which is significantly smaller than the measuring point size. The position determination is restricted by the signal noise, indicated here by error cross 82.

Figure 5:
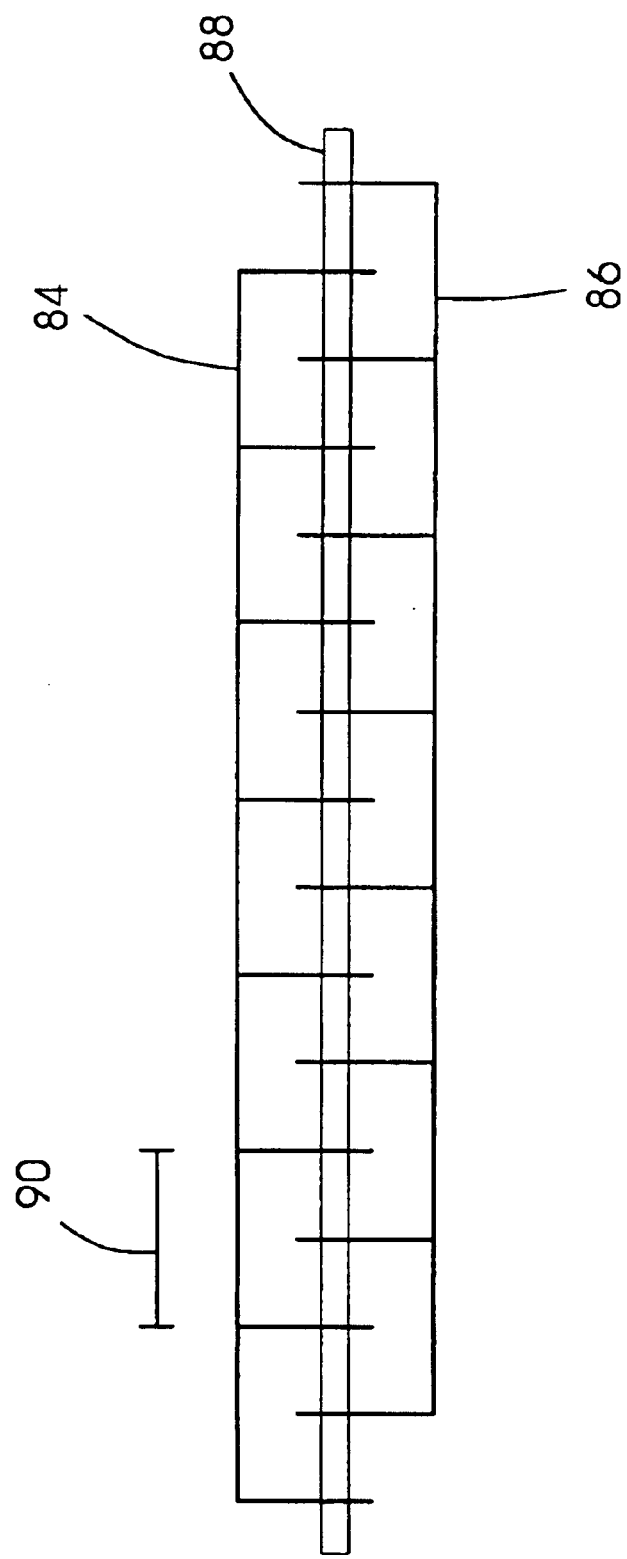
FIG. 5 shows a schematic illustration of advantageous first and second patterns having periodicity within a measuring track.

A schematic illustration of advantageous first and second patterns 84, 86 having periodicity 90 within a measuring track 88 is shown in FIG. 5. First pattern 84, imaged by first imaging beam 22, and second pattern 86, imaged by second imaging beam 34, each have a comb-like structure, which are within one another in such a way that a measuring track 88 alternately covers regions of first pattern 84 and regions of second pattern 86. Comb-like projections of patterns 84, 86 have a periodicity 90 in this case. In other words, patterns 84, 86 are regular and repeat themselves along measuring track 88. Patterns 84, 86 having many hundreds of periods of this type may be produced on a typical printing form 12. In-phase points in the periods may be used for averaging.

Advantageous first and second patterns 84, 86 shown in FIG. 5 are only one possible embodiment of advantageous linear patterns. In a consistent refinement of the idea according to the present invention, patterns may be imaged which are especially well suitable for development of the measuring point expansion. In other words, a pattern may be used which, when Fourier transformed, is expedient for simple development.

In summary, it may be established that using one or more patterns having the properties described, the position of the projection points of the imaging beams may be determined with high precision both in the more rapid and in the slower scanning directions. The coordinate positions measured, known via the angle encoder in the more rapid scanning direction and via the path measuring system in the slower scanning direction, may be compared to the desired coordinate positions, and the differences may be stored as offsets in the control unit and taken into consideration during the imaging. The method according to the present invention and/or its refinements may be executed completely automatically by the control unit of the imaging device. The automatic execution may run in the form of a calibration sequence which may be started after the insertion of a printing form into the printing unit, for example.

List of Reference Numbers 10 surface
12 printing form
14 printing form cylinder
16 printing unit
17 printing press
18 axis of rotation of the printing form cylinder
20 first imaging device
22 first imaging beam
24 first projection point
26 measuring device
27 measuring light beam
28 measuring point
30 path of the projection point
32 second imaging device
34 second imaging beam
36 second projection point
38 first direction
40 second direction
42 linear actuator system
44 path measuring system
46 angle encoder
48 control unit
50 distance between first projection point and measuring point
52 distance between second projection point and measuring point
54 distance between first and second projection points
56 measuring raster
58 first measuring raster direction
60 second measuring raster direction
62 imaged pattern
64 reflectivity axis
66 path length axis
68 imaged region
70 non-imaged region
72 border between the regions
74 diameter of the measuring point
76 exposure duration for imaged printing form
70 exposure duration for non-imaged printing form
80 exposure time change upon transition
82 error cross
84 first pattern
86 second pattern
88 measuring track
90 periodicity
R rotation direction
T translation direction

What is claimed is:

1. A method of determining a distance of a projection point of a first imaging beam of an imaging device from a measuring point of a measuring device on a surface of a printing form, both the projection point of the first imaging beam and the measuring point of the measuring device being movable in relation to the surface of the printing form and positions of the imaging beam and the measuring point on the surface of the printing form being determinable in relation to a fixed point, comprising the steps of:

imaging a part of a first pattern using the first imaging beam as a function of the position of the imaging beam on the printing form in at least one direction spanning the surface of the printing form;

measuring reflected intensity of at least a part of light illuminating the first pattern as a function of the position of the measuring device; and forming a difference of the at least one position of the measuring device and a correlated position of the first imaging beam where the first imaging beam was located as the part of the first pattern was imaged.

2. The method as recited in claim 1 further comprising inking the imaged printing form with printing ink before the measuring step.

3. The method as recited in claim 1 wherein the imaging of the first pattern is performed in two linearly independent directions and the distance is determined in both linearly independent directions.

4. The method as recited in claim 1 wherein the measuring device is a triangulation sensor.

5. The method as recited in claim 1 wherein the surface of the printing form forms least a part of a lateral surface of a rotating body, and further comprising using an angle encoder for determining the position in a peripheral direction, and using a path measuring system for determining the position in a translation direction parallel to an axis of the rotating body.

6. The method as recited in claim 1 wherein the measurement of the reflected intensity is performed in a measuring raster, axial directions of the measuring raster being linearly independent of at least one direction of the first pattern.

7. The method as recited in claim 1 wherein measurements of the reflected intensity are performed in a measuring raster, the measuring raster being finer than the first pattern.

8. The method as recited in claim 1 wherein the first pattern has periodicity in at least one direction.

9. A method of determining a distance of a first projection point of a first imaging beam of a first imaging device from a second projection point of a second imaging beam of a second imaging device on a surface of a printing form, using a measuring point of a measuring device, the method comprising:

imaging a first pattern using the first imaging beam as a function of a position of the first imaging beam on the printing form in at least one direction spanning the surface of the printing form;

imaging a second pattern using a second imaging beam as a function of a position of the second imaging beam on the printing form in the at least one direction;

measuring the reflected intensity of at least a part of light illuminating the first pattern as a function of a position of the measuring device;

measuring the reflected intensity of at least a part of light illuminating the second pattern as a function of the position of the measuring device; and forming a difference of at least one position of the measuring device at a measuring point in the second pattern and a correlated position of the measuring device at a measuring point in the first pattern.

10. A method of determining a distance of a first projection point of a first imaging beam of a first imaging device from a second projection point of a second imaging beam of a second imaging device on a surface of a printing form, comprising the steps of:

determining the distance of the first projection point of the first imaging beam from a measuring point of a measuring device on the surface of the printing form as recited in claim 1;

determining the distance of the second projection point of the second imaging beam from the measuring point of the measuring device on the surface of the printing form; and forming a sum of the difference of the at least one position of the measuring device and the position of the first imaging beam and the difference of the at least one position of the measuring device and the position of the second imaging beam.

11. The method as recited in claim 9 wherein the first imaging device and the second imaging device are identical.

12. The method as recited in claim 9 wherein the first pattern imaged using the first imaging beam and the second pattern imaged using the second imaging beam are at least partially located in one another or transposed into one another.

13. A method of correcting time triggering of a first imaging beam of a first imaging device from a first triggering instant to a second triggering instant, the first imaging device capable of producing a first projection point on a surface of a printing form, the method comprising:

determining a distance of the first projection point to a measuring point or to a second projection point using measured reflected intensity of at least a part of light illuminating a first pattern imaged by the first imaging device as a function of the position of the measuring point, the first imaging beam being activated at the first triggering instant;

forming the difference of the distance determined and a setpoint distance; and determining the second triggering instant as the sum of the first triggering instant and a time necessary to scan the difference with the first projection point, the time necessary being a function of a relative speed of the first imaging beam and an orientation of the surface of the printing form.

14. A method of correcting time triggering of a measuring beam of a measuring device from a first triggering instant to a second triggering instant, the measuring device capable of producing a measuring point on a surface of a printing form, the method comprising:

determining a distance of the measuring point to a first projection point using measured reflected intensity of at least a part of light illuminating a first pattern imaged by the first imaging device as a function of the position of the measuring device, the measuring point being activated at the first triggering instant;

forming a difference of the distance determined and a setpoint distance; and determining the second triggering instant as the sum of the first triggering instant and a time necessary in order to scan the difference with the measuring point, the time necessary being a function of a relative speed of the measuring beam and an orientation of the surface of the printing form.

15. A printing unit comprising:

at least one first imaging device;

a measuring device;

a printing form having a surface; and at least one control unit, the control unit including an electronic system having a memory unit, the memory unit storing a computer program capable of executing the following program steps:

imaging a part of a first pattern using an imaging beam of the first imaging device as a function of the position of the imaging beam on the printing form in at least one direction spanning the surface of the printing form;

measuring reflected intensity of at least a part of light illuminating the first pattern as a function of the position of the measuring device; and forming a difference of the at least one position of the measuring device and a correlated position of the first imaging beam where the first imaging beam was located as the part of the first pattern was imaged.

16. A printing press comprising:

at least one printing unit as recited in claim 15.

* * * * *